(12) United States Patent
Wang et al.

(10) Patent No.: US 10,644,167 B2
(45) Date of Patent: May 5, 2020

(54) THIN FILM TRANSISTOR AND MANUFACTURING METHOD THEREOF (71) Applicants: Industrial Technology Research Institute, Hsinchu (TW); Intellectual Property Innovation Corporation, Hsinchu (TW)

(72) Inventors: Tai-Jui Wang, Kaohsiung (TW); Yung-Hui Yeh, Hsinchu (TW); Jui-Wen Yang, New Taipei (TW); Hsiao-Chiang Yao, Kaohsiung (TW); Chun-Hung Chu, Hsinchu (TW)

(73) Assignees: Industrial Technology Research Institute, Hsinchu (TW); Intellectual Property Innovation Corporation, Hsinchu (TW)

( * ) Notice: Subject to any disclaimer, the term of this patent is extended or adjusted under 35 U.S.C. 154(b) by 2 days.

(21) Appl. No.: 15/913,897

(22) Filed: Mar. 6, 2018

(65) Prior Publication Data
US 2019/0140106 A1    May 9, 2019

(30) Foreign Application Priority Data
Nov. 6, 2017  (TW) ............... 106138318 A (51) Int. Cl.
*H01L 29/786* (2006.01)
*H01L 51/05* (2006.01)
(Continued)

(52) U.S. Cl.
CPC ........ *H01L 29/78696* (2013.01); *C23C 16/24* (2013.01); *C23C 16/345* (2013.01);
(Continued)

(58) Field of Classification Search
CPC ......... H01L 29/78696; H01L 21/02422; H01L 21/0245; C23C 16/24; C23C 16/345
See application file for complete search history.

(56) References Cited

U.S. PATENT DOCUMENTS

| 6,278,131 B1 | 8/2001 | Yamazaki et al. |
| 7,221,012 B2 | 5/2007 | Chu et al. |
(Continued)

FOREIGN PATENT DOCUMENTS

| CN | 101540342 | 9/2009 |
| CN | 101752424 | 6/2010 |
(Continued)

OTHER PUBLICATIONS

Young-Hwan Kim, Eunji Lee et al., "Highly Robust Neutral Plane Oxide TFT's Wighstanding 0.25 mm Bending Radius for Stretchable Electronics". May 11, 2016: DOI No. 10.1038/srep25734.*
(Continued)

*Primary Examiner* — Zandra V Smith
*Assistant Examiner* — Andre C Stevenson
(74) *Attorney, Agent, or Firm* — JCIPRNET (57) ABSTRACT A thin film transistor including a flexible substrate, a semiconductor layer, a first gate, and a first gate dielectric layer is provided. The semiconductor layer is located on the flexible substrate. The first gate is located on the flexible substrate and corresponds to a portion of the semiconductor layer. The first gate dielectric layer is located between the first gate and the semiconductor layer. The first gate dielectric layer is in contact with the semiconductor layer, and the hydrogen atom concentration of the first gate dielectric layer is less than $6.5 \times 10^{20}$ atoms/cm$^3$. A method of manufacturing the thin film transistor is also provided.

20 Claims, 11 Drawing Sheets (51) Int. Cl.
*H01L 29/49* (2006.01)
*H01L 27/12* (2006.01)
*H01L 21/02* (2006.01)
*C23C 16/24* (2006.01)
*C23C 16/34* (2006.01)
*C23C 16/40* (2006.01)
*H01L 29/66* (2006.01)

(52) U.S. Cl.
CPC ...... *C23C 16/401* (2013.01); *H01L 21/02422* (2013.01); *H01L 21/02425* (2013.01); *H01L 21/02488* (2013.01); *H01L 21/02675* (2013.01); *H01L 27/1237* (2013.01); *H01L 27/1255* (2013.01); *H01L 27/1277* (2013.01); *H01L 29/4908* (2013.01); *H01L 29/66757* (2013.01); *H01L 29/78603* (2013.01); *H01L 29/78645* (2013.01); *H01L 29/78648* (2013.01); *H01L 29/78675* (2013.01); *H01L 29/78678* (2013.01); *H01L 51/0545* (2013.01)

(56) References Cited

U.S. PATENT DOCUMENTS

| | | | |
|---|---|---|---|
| 7,812,344 | B2 | 10/2010 | Yan et al. |
| 8,373,168 | B2 | 2/2013 | Yan et al. |
| 9,252,165 | B2 | 2/2016 | Yan et al. |
| 9,287,137 | B2 | 3/2016 | Wang et al. |
| 9,293,589 | B2* | 3/2016 | Yamazaki ......... H01L 29/66969 |
| 9,368,441 | B2 | 6/2016 | Yan et al. |
| 9,449,990 | B2 | 9/2016 | Miki et al. |
| 2005/0012152 | A1* | 1/2005 | Park ................ H01L 27/1285 257/347 |
| 2010/0133255 | A1* | 6/2010 | Bahng .............. H01L 21/02071 219/444.1 |
| 2014/0073119 | A1* | 3/2014 | Bedell ................ H01L 29/7847 438/480 |
| 2016/0105114 | A1 | 4/2016 | Hosoyama et al. |
| 2017/0170207 | A1 | 6/2017 | Wang et al. |

FOREIGN PATENT DOCUMENTS

| | | |
|---|---|---|
| CN | 102656690 | 9/2012 |
| CN | 102790095 | 11/2012 |
| CN | 103140920 | 6/2013 |
| CN | 105140208 | 12/2015 |
| CN | 106876341 | 6/2017 |
| TW | I281586 | 5/2007 |
| TW | I343129 | 6/2011 |
| TW | 201220432 | 5/2012 |
| TW | 201434077 | 9/2014 |
| TW | I508292 | 11/2015 |
| TW | I535026 | 5/2016 |
| TW | I555150 | 10/2016 |
| TW | I578505 | 4/2017 |

OTHER PUBLICATIONS

Young-Hwan Kim, Eunji Lee et al., "Highly Robust Neutral Plane Oxide TFT's Wighstanding 0.25 mm Bending Radius for Stretchable Electronics". May 11, 2016: DOI No. 10.1038/srep25734 (Year: 2016).*

"Office Action of Taiwan Counterpart Application", dated Apr. 30, 2018, p. 1-p. 13.

* cited by examiner

THIN FILM TRANSISTOR AND MANUFACTURING METHOD THEREOF

CROSS-REFERENCE TO RELATED APPLICATION

This application claims the priority benefit of Taiwan application serial no. 106138318, filed on Nov. 6, 2017. The entirety of the above-mentioned patent application is hereby incorporated by reference herein and made a part of this specification.

BACKGROUND

1. Technical Field

The disclosure relates to a thin film transistor and a manufacturing method thereof.

2. Description of Related Art

With a rapid development of electronic technology, new electronic products are continually introduced. In order to be applied in various fields, electronic products that are flexible, slim, compact, light, and have no specific form are gradually noticed.

Most flexible electronic products currently being sold are bendable products with a fixed curvature. To ensure foldability, flexible electronic products with small bending radii are big challenge in the future. Therefore, how to make a flexible electronic product with a small bending radius and good manufacturing yield as well as product reliability has become an issue.

SUMMARY

A thin film transistor provided in an embodiment of the disclosure includes a flexible substrate, a semiconductor layer, a first gate, and a first gate dielectric layer. The semiconductor layer is located on the flexible substrate. The first gate is located on the flexible substrate and corresponds to a portion of the semiconductor layer. The first gate dielectric layer is located between the first gate and the semiconductor layer. The first gate dielectric layer is in contact with the semiconductor layer, and a hydrogen atom concentration of the first gate dielectric layer is less than $6.5 \times 10^{20}$ atoms/cm$^3$.

A manufacturing method of the thin film transistor provided in an embodiment of the disclosure includes following steps. A semiconductor layer is formed on a flexible substrate; a first gate dielectric layer is formed on and in contact with the semiconductor layer, and a hydrogen atom concentration of the first gate dielectric layer is less than $6.5 \times 10^{20}$ atoms/cm$^3$; a first gate is forming on the first gate dielectric layer, and the first gate corresponds to a portion of the semiconductor layer.

In order to make the disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

FIG. 1A to FIG. 1E are schematic cross-sectional views of a manufacturing method of a thin film transistor according to a first embodiment of the disclosure.

Figure 1A:
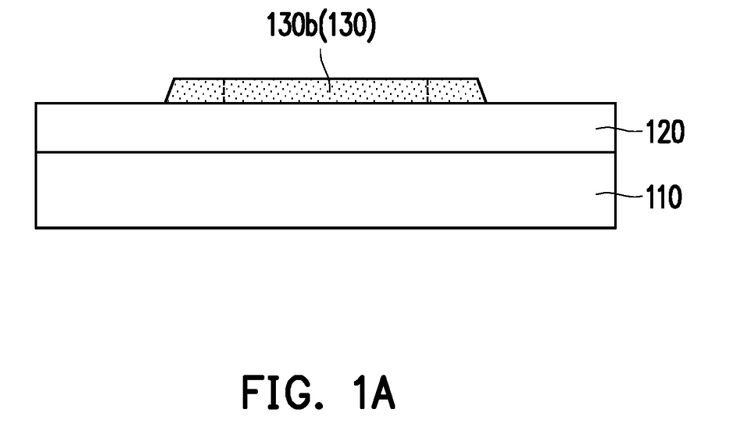
FIG. 1A to FIG. 1E are schematic cross-sectional views of a manufacturing method of a thin film transistor according to a first embodiment of the disclosure.

Referring to FIG. 1A, a flexible substrate 110 is provided. A material of the flexible substrate 110 may be, for example, polyimide (PI), polycarbonate (PC), polyethersulfone (PES), polyacrylate (PA), polynorbornene (PNB), polyethylene terephthalate (PET), polyetheretherketone (PEEK), polyethylene naphthalate (PEN), polyetherimide (PEI), or other flexible materials; the disclosure is not limited thereto.

In some embodiments, a buffer layer 120 may be first formed on the flexible substrate 110 before forming a subsequent film. The buffer layer 120 may be a single-layered thin film or a stacked layer composed of a plurality of thin films; the number of layers of the buffer layer 120, the material of the buffer layer 120, or the way to form the buffer layer 120 is not limited in the embodiment. When the buffer layer 120 is the stacked layer composed of a plurality of thin films, the buffer layer 120 is, for example, a stacked layer composed of organic and inorganic thin films that are alternately stacked, or the buffer layer 120 may be a stacked layer composed of a plurality of inorganic thin films stacked together. When the buffer layer 120 is the stacked layer composed of a plurality of inorganic thin films stacked together, the buffer layer 120 may be a stacked layer in which silicon nitride ($SiN_x$) and silicon oxide ($SiO_x$) are alternately stacked. The buffer layer 120 may be characterized by a good bonding force or a lower vapor water transmission rate (VWTR), so as to enhance the reliability of a thin film transistor 100. The buffer layer 120 may also be characterized by good thermal insulation, so as to reduce possible impact on the flexible substrate 110 due to a temperature increase during a process of forming the subsequent film.

Next, a semiconductor layer 130 is formed on the flexible substrate 110. For example, a chemical vapor deposition (CVD) process, a photolithography and etching process, or other similar deposition processes and a patterning process may be applied to form a patterned amorphous silicon film on the flexible substrate 110. The amorphous silicon film may then become a polysilicon film via laser crystallization or excimer laser annealing (ELA), and the amorphous silicon film may be scanned with use of a laser and is recrystallized, so that the amorphous silicon film may become the semiconductor layer 130 with polysilicon. In other words, the material of the semiconductor layer 130 may include a polysilicon material. This technology of forming polysilicon may be referred to as a low temperature polysilicon (LTPS) process. In general, the entire manufacturing process of the semiconductor layer 130 may be performed at a low process temperature (e.g., below 600 degrees Celsius) through performing the LTPS process, so that the flexible substrate 110 may still have good stability or properties during the manufacturing process of the semiconductor layer 130.

In some embodiments, an ion implantation process (not shown) may be further performed, so that the resultant semiconductor layer 130 may have doped ions, and a channel region 130b with N-type or P-type dopant may be formed according to different types of doped ions.

Figure 1B:
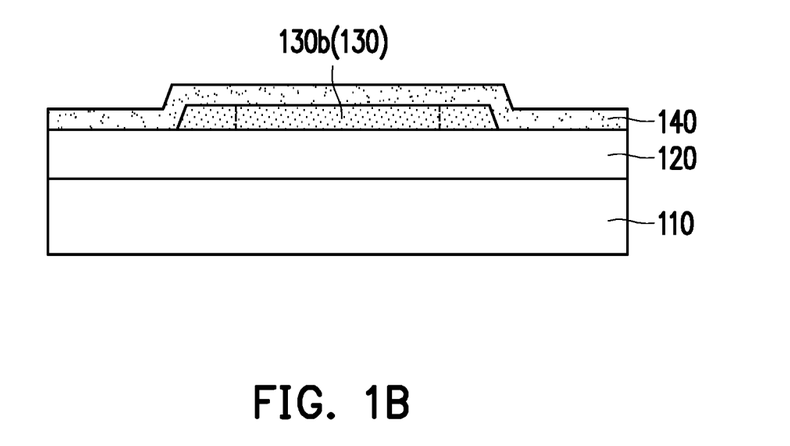

Referring to FIG. 1B, after the semiconductor layer 130 is formed on the flexible substrate 110, a first gate dielectric layer 140 is formed on the semiconductor layer 130. The first gate dielectric layer 140 may be formed through performing a deposition process. The first gate dielectric layer 140 conformally covers the semiconductor layer 130 and directly contacts the semiconductor layer 130. In the embodiment, the first gate dielectric layer 140 may be a silicon nitride layer, a silicon oxynitride (SiON) layer, or a silicon oxide layer doped with hydrogen atoms through performing a plasma-enhanced chemical vapor deposition (PECVD) process after mixing hydrogen, $Si_nH_{n+2}$ (e.g., silane ($SiH_4$)), carrier gas (inert gas, e.g., helium (He)), and gas containing oxygen/nitrogen (e.g., dinitrogen monoxide ($N_2O$) or ammonia ($NH_3$)).

In the PECVD process of forming the first gate dielectric layer 140, a ratio of an inert gas flow to the total process gas flow is from 0.5 to 0.7, so that a hydrogen atom concentration of the first gate dielectric layer 140 formed may be less than $6.5 \times 10^{20}$ atoms/cm$^3$. In the embodiment, the inert gas may be He, but the disclosure is not limited thereto. In other embodiments, the inert gas may also be helium (He), neon (Ne), argon (Ar), krypton (Kr), xenon (Xe), radon (Rn), or a combination thereof. In addition, in the PECVD process of forming the first gate dielectric layer 140, other process parameters (e.g., radio frequency (Rf) power) may be adjusted, so that a good deposition rate (e.g., 2.5 Å/sec to 3.5 Å/sec) and good film quality may be achieved.

Figure 1C:
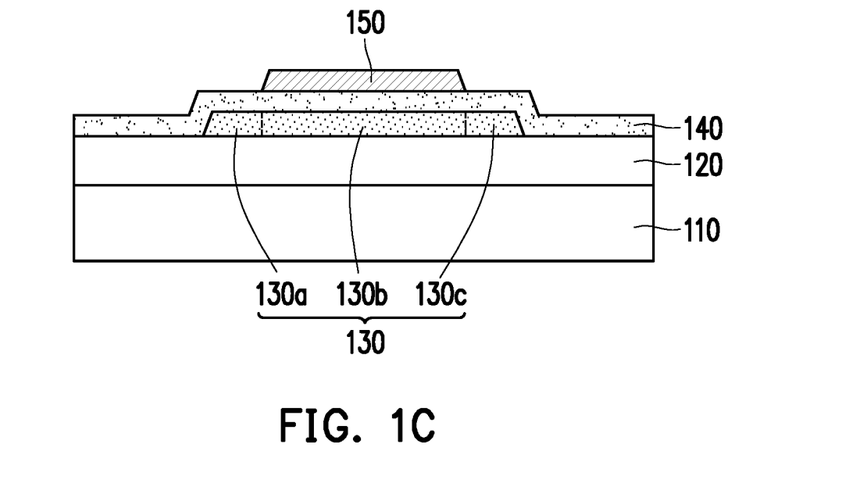

Next, referring to FIG. 1C, a first gate 150 is formed on the first gate dielectric layer 140, wherein the first gate 150 is located right above the channel region 130b of the semiconductor layer 130. The first gate 150 may be formed through performing a deposition process, a patterning process, and other suitable processes. The material of the first gate 150 or the way to form the first gate 150 is not limited in the embodiment. However, the first gate 150 needs to have conductivity for transmitting electronic signals.

An ion implantation process (not shown) is then performed with use of the first gate dielectric layer 140 as a mask to form a source region 130a and a drain region 130c separated from each other at opposite ends of the semiconductor layer 130. The ion implantation process on the source region 130a and the drain region 130c is, for example, performed by implanting ions with appropriate energy, such as arsenic (As), phosphorus (P) and boron (B) as doped ions, so as to form P-type or N-type source region 130a and drain region 130c.

Figure 1D:
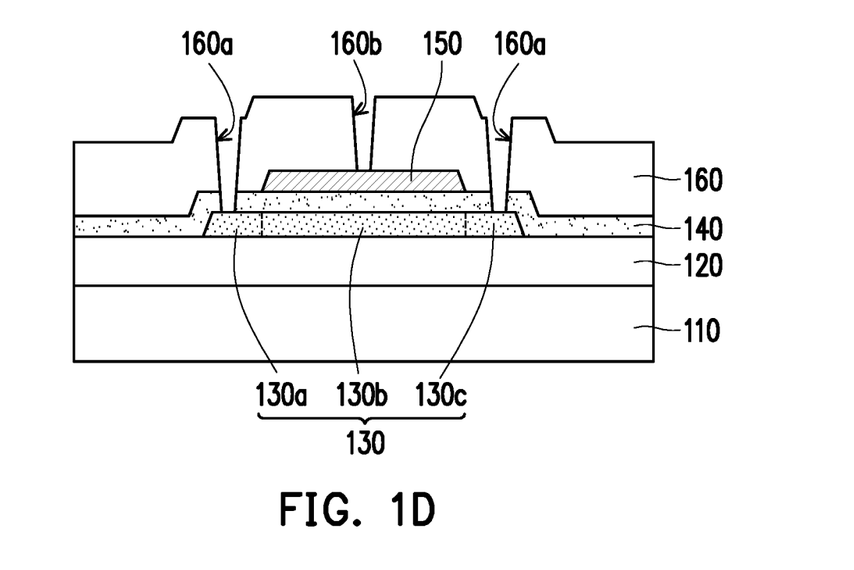

With reference to FIG. 1D, after the source region 130a and the drain region 130c are formed in the semiconductor layer 130, an insulation layer 160 is formed on the first gate dielectric layer 140, so as to cover a portion of the first gate dielectric layer 140 and the first gate 150 located on the first gate dielectric layer 140. The insulation layer 160 may be formed through performing the deposition process, a coating process, or other suitable processes. The insulation layer 160 may be a single-layered thin film or a stacked layer composed of a plurality of thin films; the number of layers of the insulation layer 160, the material of the insulation layer 160, or the way to form the insulation layer 160 is not limited in the embodiment. However, the insulation layer 160 needs to have the property of electrical insulation.

In the embodiment, the insulation layer 160 conformally covers the first gate dielectric layer 140 and the first gate 150, but the disclosure is not limited thereto. In some embodiments, the insulation layer 160 may have a flat surface through performing a polishing process, for example, so that other films subsequently formed on the insulation layer 160 may be located on the flat surface of the insulation layer 160.

First and second openings 160a and 160b may then be formed on the insulation layer 160 through performing an etching process or a laser drilling process. The first openings 160a penetrate the insulation layer 160 and the first gate dielectric layer 140 to expose a portion of the source region 130a and a portion of the drain region 130c. The second opening 160b penetrates the insulation layer 160 to expose a portion of the first gate 150.

Figure 1E:
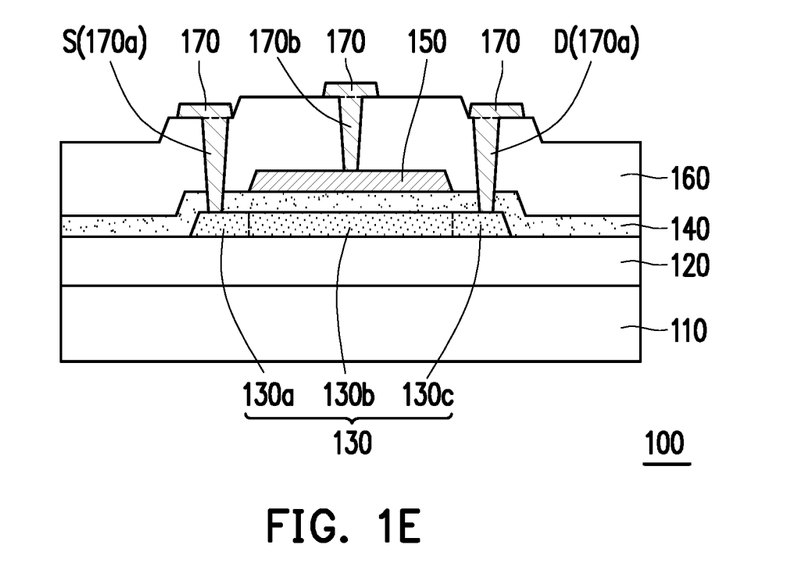

With reference to FIG. 1E, the first openings 160a and the second opening 160b may be filled with conductive substance through performing the deposition process and/or a plating process to form a plurality of first conductive vias 170a and at least one second conductive via 170b. The first conductive vias 170a located in the first openings 160a are electrically connected to the source region 130a and the drain region 130c. The first conductive via 170a corresponding to the source region 130a may be a source S, and the first conductive via 170a corresponding to the drain region 130c may be a drain D. The second conductive via 170b located in the second opening 160b is electrically connected to the first gate 150.

In the embodiment, the conductive substance filling the first openings 160a and the second opening 160b may further cover the insulation layer 160. Subsequently, the conductive substance covering the insulation layer 160 may be patterned through performing the photolithography and etching process to form a patterned conductive layer 170.

After said manufacturing steps are performed, the thin film transistor 100 provided in the embodiment is substantially formed. The thin film transistor 100 includes the flexible substrate 110, the semiconductor layer 130, the first gate 150, the first gate dielectric layer 140, the source S, and the drain D. The semiconductor layer 130 is located on the flexible substrate 110 and includes the source region 130a, the channel region 130b, and the drain region 130c, wherein the channel region 130b is located between the source region 130a and the drain region 130c. The source S and the drain D are respectively coupled to the source region 130a and the drain region 130c of the semiconductor layer 130. The first gate 150 is located on the flexible substrate 110 and corresponds to the channel region 130b of the semiconductor layer 130. The first gate dielectric layer 140 is located between the first gate 150 and the semiconductor layer 130, the first gate dielectric layer 140 is in contact with the semiconductor layer 130, and a hydrogen atom concentration of the first gate dielectric layer 140 is less than $6.5 \times 10^{20}$ atoms/cm$^3$.

In silicon thin films, silicon atoms and hydrogen atoms may generate Si—H bonding through doped hydrogen atoms, so as to reduce the number of dangling bonds of silicon atoms within a silicon film. In normal electronic devices, if the transistors of the electronic devices subject to a bending force may have electrical defects (e.g., changes of threshold voltage (Vth)) because the Si—H bonding in the gate dielectric layer is broken. Therefore, in the thin film transistor 100 provided in the embodiment, the hydrogen atom concentration of the first gate dielectric layer 140 may be reduced, so as to correspondingly reduce the number of Si—H bonds in the first gate dielectric layer 140. Thereby, after the bending stress is exerted to the thin film transistor 100, the possible electrical defects of the thin film transistor 100 due to the bond breaking of the Si—H bonding in the first gate dielectric layer 140 may be reduced. For example, in the embodiment, since the hydrogen atom concentration of the first gate dielectric layer 140 is less than $6.5 \times 10^{20}$ atoms/cm$^3$, the thin film transistor 100 may have a small bending radius of at least 1 mm. A difference between a threshold voltage variation of the thin film transistor 100 with the small bending radius of at least 1 mm and the threshold voltage variation of the thin film transistor 100 that is not bended is below 0.05 volt (V). That is, there is not much change in the threshold voltage variation of the thin film transistor 100.

In the embodiment, the semiconductor layer 130 is located between the flexible substrate 110 and the first gate 150. In other words, the thin film transistor 100 in the embodiment has a top gate structure, but the disclosure is not limited thereto.

In the embodiment, the semiconductor layer 130 is formed through performing the LTPS process. In other words, a material of the semiconductor layer 130 includes crystalline silicon and/or amorphous silicon, but the disclosure is not limited thereto.

Figure 2:
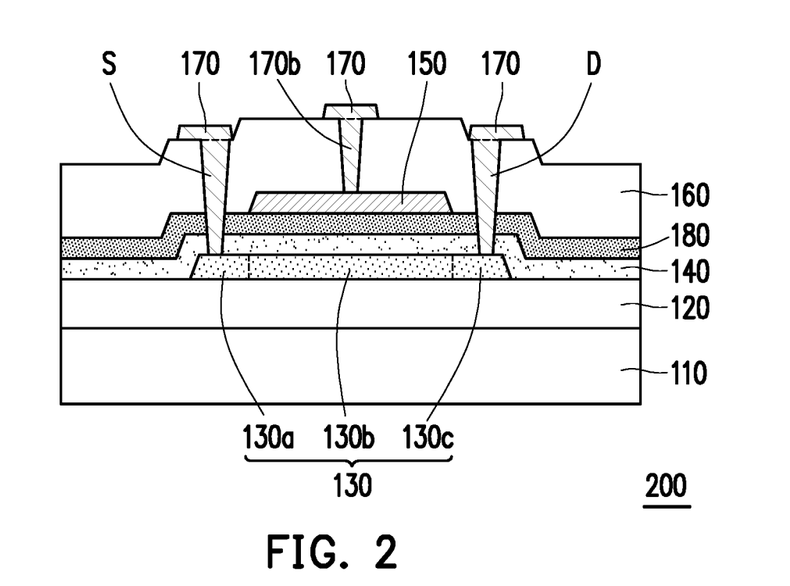
FIG. 2 is a schematic cross-sectional view of a thin film transistor according to a second embodiment of the disclosure.

FIG. 2 is a schematic cross-sectional view of a thin film transistor according to a second embodiment of the disclosure. Referring to FIG. 1E and FIG. 2, the difference between a thin film transistor 200 provided in the embodiment and the thin film transistor 100 depicted in FIG. 1E lies in that the thin film transistor 200 further includes a second gate dielectric layer 180 located between the first gate 150 and the first gate dielectric layer 140, and a hydrogen atom concentration of the second gate dielectric layer 180 may be greater than $6.5 \times 10^{20}$ atoms/cm$^3$.

Figure 3A:
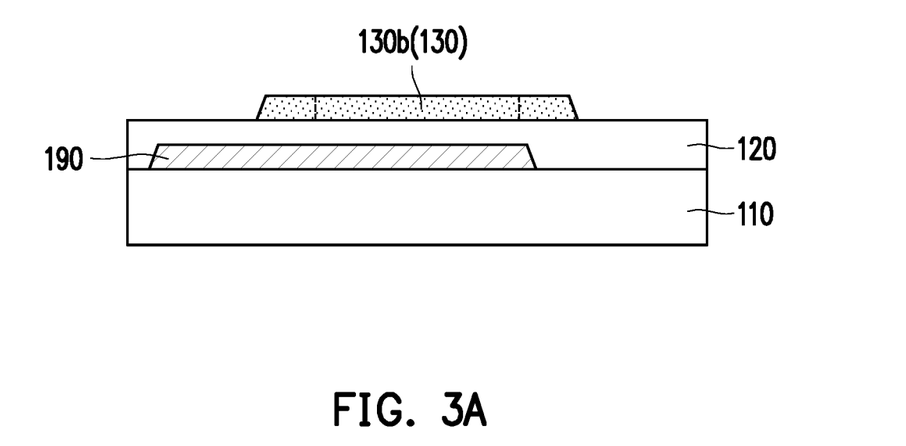
FIG. 3A and FIG. 3B are schematic cross-sectional views of a manufacturing method of a thin film transistor according to a third embodiment of the disclosure.
Figure 3B:
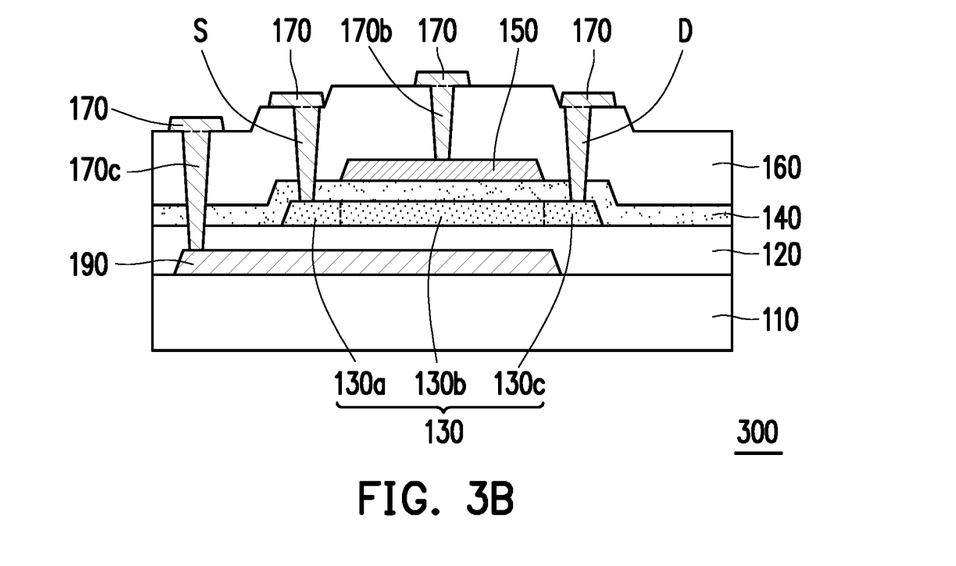

FIG. 3A and FIG. 3B are schematic cross-sectional views of a manufacturing method of a thin film transistor according to a third embodiment of the disclosure. Referring to FIG. 3A and FIG. 3B, the manufacturing method of a thin film transistor 300 provided in the embodiment and the manufacturing method of the thin film transistor 100 embodied in FIG. 1A and FIG. 1E are similar, while the difference therebetween lies in that a second gate 190 is formed on the flexible substrate 110 before forming the buffer layer 120. The way to form the second gate 190 may be similar to the way to form the first gate 150 according to the aforementioned embodiments and thus will not be described in detail herein. Some openings (not shown) on the insulation layer 160 may penetrate the insulation layer 160, the first gate dielectric layer 140, and the buffer layer 120, so as to form a third conductive via 170c connected to the patterned conductive layer 170 and the second gate 190 after the openings are filled with conductive substance. Except for said step, the other steps of manufacturing the thin film transistor are identical or similar to those depicted in FIG. 1D to FIG. 1H and thus will not be described in detail herein.

Referring to FIG. 1E and FIG. 3B, the difference between the thin film transistor 300 provided in the embodiment and the thin film transistor 100 depicted in FIG. 1E lies in that the second gate 190 is located between the flexible substrate 110 and the semiconductor layer 130. The first gate 150 and the second gate 190 may receive/transmit identical or similar electronic signals. In other words, the thin film transistor 300 provided in the embodiment has a dual gate structure.

Figure 4:
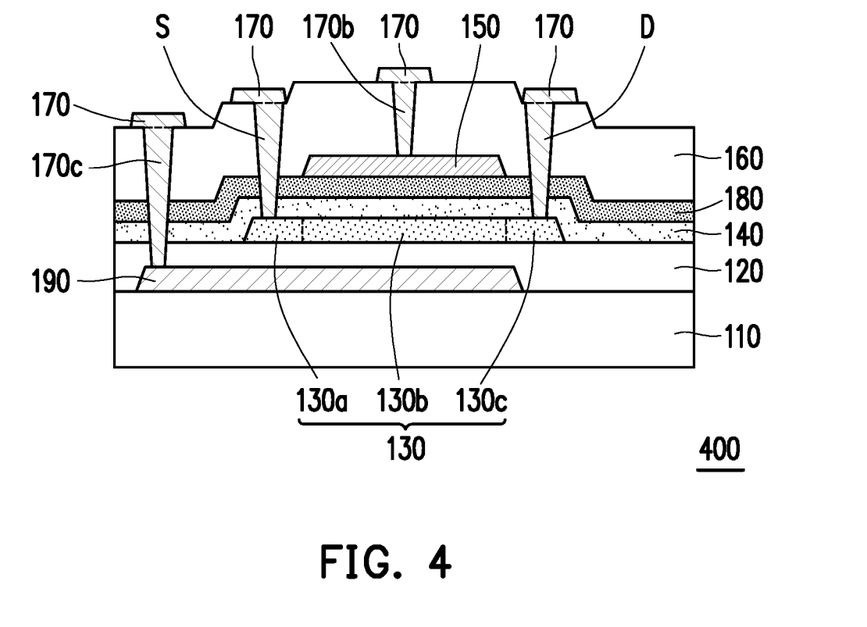
FIG. 4 is a schematic cross-sectional view of a thin film transistor according to a fourth embodiment of the disclosure.

FIG. 4 is a schematic cross-sectional view of a thin film transistor according to a fourth embodiment of the disclosure. Referring to FIG. 3B and FIG. 4, the difference between a thin film transistor 400 provided in the embodiment and the thin film transistor 300 depicted in FIG. 3B lies in that the thin film transistor 400 further includes the second gate dielectric layer 180 located between the first gate 150 and the first gate dielectric layer 140, and a hydrogen atom concentration of the second gate dielectric layer 180 may be greater than $6.5 \times 10^{20}$ atoms/cm$^3$.

FIG. 5A to FIG. 5E are schematic cross-sectional views of a manufacturing method of a thin film transistor according to a fifth embodiment of the disclosure. Referring to both FIG. 5A to FIG. 5E and FIG. 1A to FIG. 1E, in the embodiment, the manufacturing method of a thin film transistor 500 is similar to the manufacturing method of the thin film transistor 100, and similar components are denoted by identical reference numbers and have similar functions. Therefore, relevant descriptions are omitted.

Figure 5A:
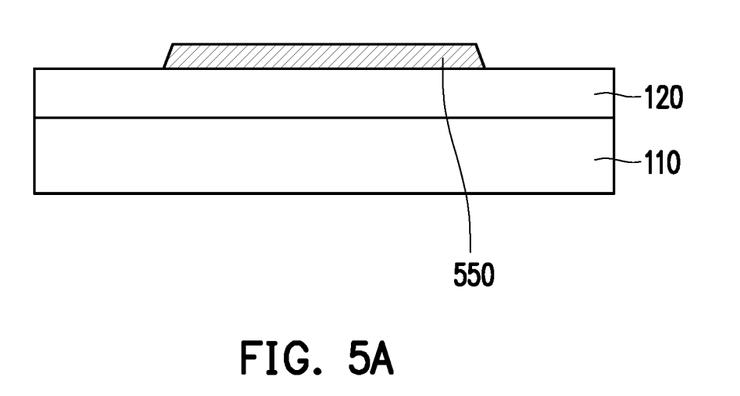
FIG. 5A to FIG. 5E are schematic cross-sectional views of a manufacturing method of a thin film transistor according to a fifth embodiment of the disclosure.

Referring to FIG. 5A, a flexible substrate 110 is provided. In addition, the buffer layer 120 may be selectively formed on the flexible substrate 110 before forming a subsequent film. Next, a first gate 550 is formed on the flexible substrate 110. In the embodiment, the material of the first gate 550 or the way to form the first gate 550 may be identical or similar to the material of the first gate 150 or the way to form the first gate 150 according to the previous embodiment and thus will not be described in detail herein.

Figure 5B:
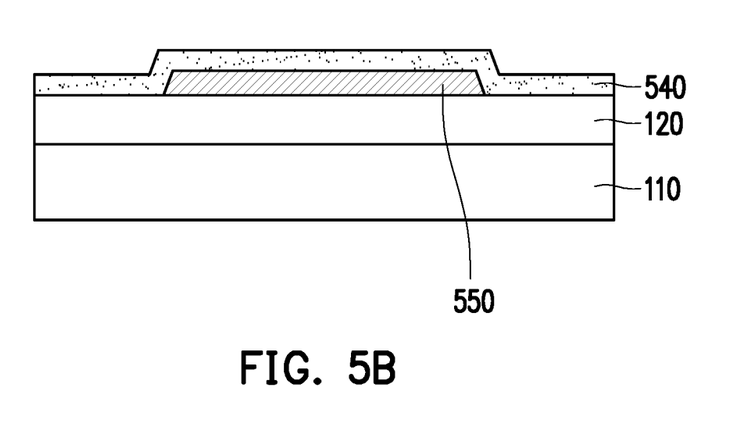

Next, referring to FIG. 5B, after the first gate 550 is formed, a first gate dielectric layer 540 doped with hydrogen atoms is formed on the first gate 550, and a hydrogen atom concentration of the first gate dielectric layer 540 is less than $6.5 \times 10^{20}$ atoms/cm$^3$. In the embodiment, the material of the first gate dielectric layer 540 or the way to form the first gate dielectric layer 540 may be identical or similar to the material of the first gate dielectric layer 140 or the way to form the first gate dielectric layer 140 according to the previous embodiment and thus will not be described in detail herein.

Figure 5C:
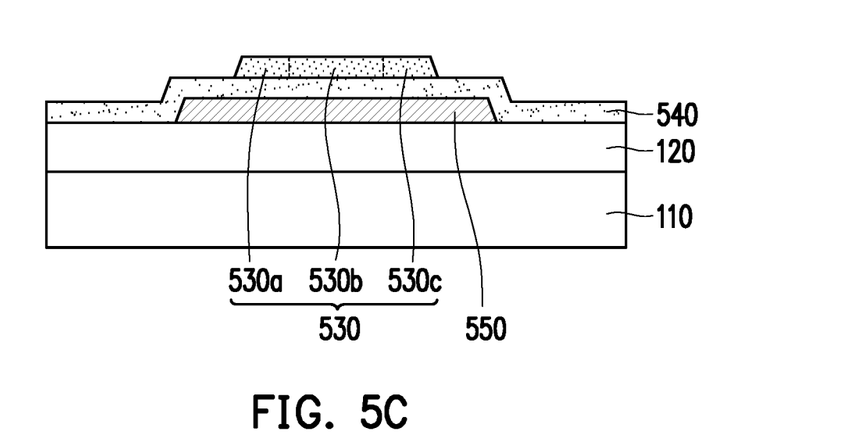

Next, referring to FIG. 5C, a semiconductor layer 530 is formed through performing a LTPS process after the first gate dielectric layer 540 is formed. The semiconductor layer 530 is located on the first gate dielectric layer 540 and directly contacts the first gate dielectric layer 540. Subsequently, a source region 530a, a channel region 530b, and a drain region 530c with different dopants may be formed at the semiconductor layer 530 through performing a regional ion implantation process. In the embodiment, the material of the semiconductor layer 530 or the way to form the semiconductor layer 530 may be identical or similar to the material of the semiconductor layer 130 or the way to form the semiconductor layer 130 according to the previous embodiment and thus will not be described in detail herein.

Figure 5D:
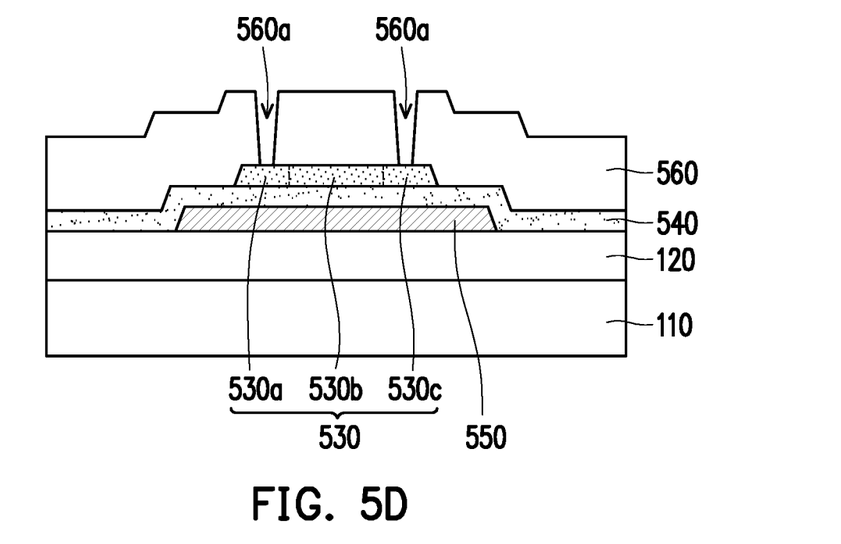

Next, referring to FIG. 5D, after the semiconductor layer 530 is formed, an insulation layer 560 is formed on the semiconductor layer 530. The insulation layer 560 covers a portion of the first gate dielectric layer 540 and the semiconductor layer 530 on the first gate dielectric layer 540. Subsequently, first openings 560a are formed on the insulation layer 560 to expose a portion of the source region 530a and a portion of the drain region 530c. In the embodiment, the material of the insulation layer 560 or the way to form the insulation layer 560 may be identical or similar to the material of the insulation layer 160 and the way to form the insulation layer 160 according to the previous embodiment, and the way to form the first openings 560a may be identical or similar to the way to form the first openings 160a according to the previous embodiment; hence, relevant descriptions will be omitted hereinafter.

Figure 5E:
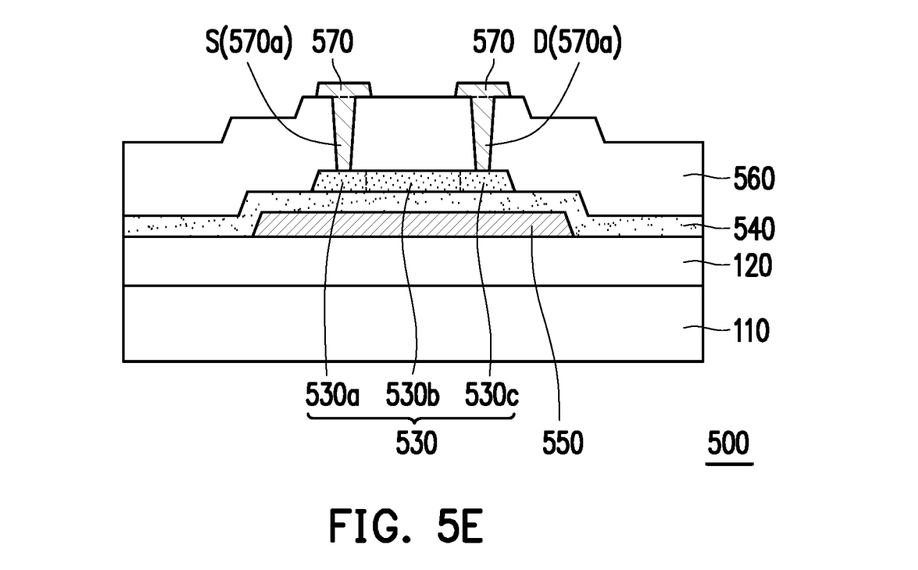

Next, referring to FIG. 5E, the first openings 560a are filled with conductive substance to form a plurality of first conductive vias 570a. The first conductive via 570a corresponding to the source region 530a may be the source S, and the first conductive via 570a corresponding to the drain region 530c may be the drain D. The conductive substance filling the first openings 560a may further cover the insulation layer 560, and the conductive substance covering the insulation layer 560 may be patterned to form a patterned conductive layer 570. In the embodiment, the material of the first conductive vias 570a and the patterned conductive layer 570 or the way to form the first conductive vias 570a and the patterned conductive layer 570 may be identical or similar to the material of the first conductive vias 170a and the patterned conductive layer 170 and the way to form the first conductive vias 170a and the patterned conductive layer 170 and thus will not be described in detail herein.

After the above-mentioned manufacturing steps are performed, the thin film transistor 500 provided in the embodiment may be substantially formed. The difference between the thin film transistor 500 provided in the embodiment and the thin film transistor 100 depicted in FIG. 1E lies in that the first gate 550 is located between the flexible substrate 110 and the semiconductor layer 530. In other words, the thin film transistor 500 provided in the embodiment has a bottom gate structure.

Figure 6:
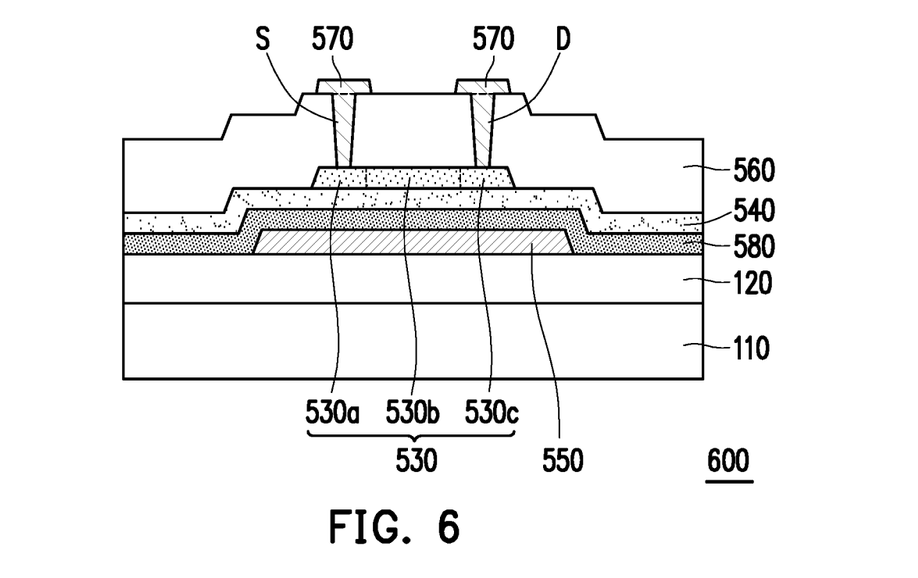
FIG. 6 is a schematic cross-sectional view of a thin film transistor according to a sixth embodiment of the disclosure.

FIG. 6 is a schematic cross-sectional view of a thin film transistor according to a sixth embodiment of the disclosure. Referring to FIG. 5 and FIG. 6, the difference between a thin film transistor 600 provided in the embodiment and the thin film transistor 500 depicted in FIG. 5 is lies in that the thin film transistor 600 further includes a second gate dielectric layer 580 located between the first gate 550 and the first gate dielectric layer 540. In the embodiment, the material of the second gate dielectric layer 580 or the way to form the second gate dielectric layer 580 may be identical or similar to the material of the second gate dielectric layer 180 or the way to form the second gate dielectric layer 180 according to the previous embodiment and thus will not be described in detail herein.

Figure 7:
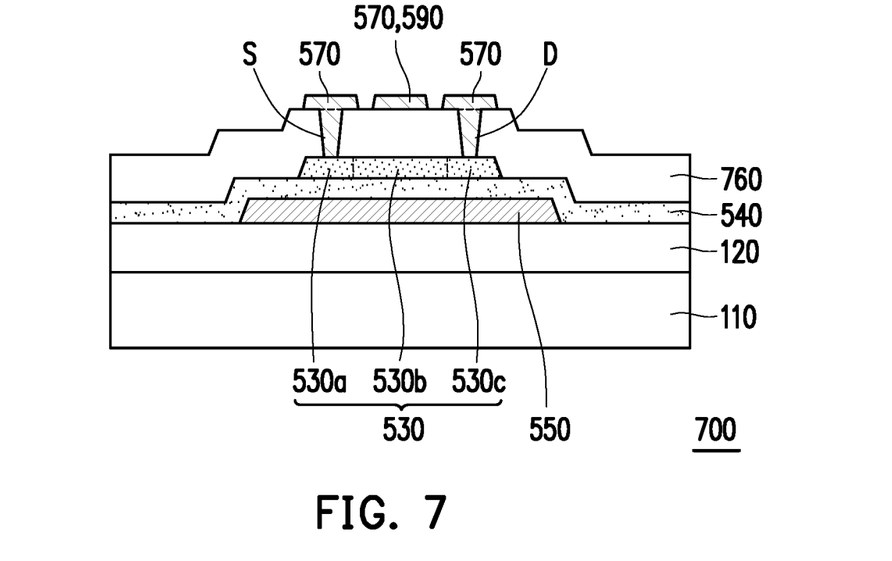
FIG. 7 is a schematic cross-sectional view of a thin film transistor according to a seventh embodiment of the disclosure.

FIG. 7 is a schematic cross-sectional view of a thin film transistor according to a seventh embodiment of the disclosure. Referring to FIG. 5 and FIG. 7, the difference between a thin film transistor 700 provided in the embodiment and the thin film transistor 500 depicted in FIG. 5 lies in that a portion of the patterned conductive layer 570 corresponds to the channel region 530b of the semiconductor layer 530 and may serve as a second gate 590. The first gate 550 and the second gate 590 may receive/transmit identical or similar electronic signals. In other words, the thin film transistor 700 provided in the embodiment has a dual gate structure. In addition, the insulation layer 760 provided in the embodiment may have a smaller thickness than that of the insulation layer 560 provided in the previous embodiment.

Figure 8:
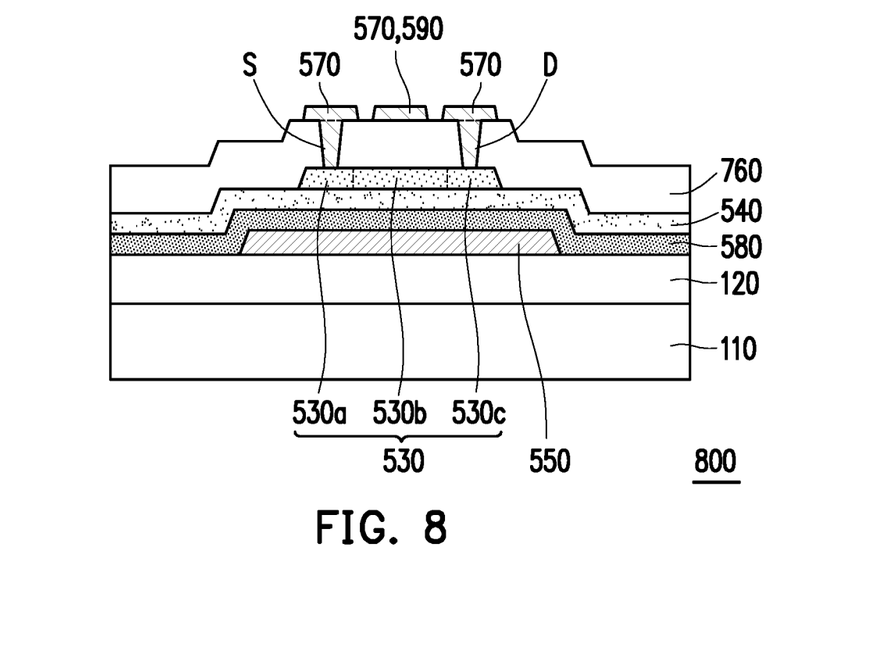
FIG. 8 is a schematic cross-sectional view of a thin film transistor according to an eight embodiment of the disclosure.

FIG. 8 is a schematic cross-sectional view of a thin film transistor according to an eight embodiment of the disclosure. Referring to FIG. 7 and FIG. 8, the difference between a thin film transistor 800 provided in the embodiment and the thin film transistor 700 depicted in FIG. 7 lies in that the thin film transistor 800 further includes the second gate dielectric layer 580 located between the first gate 550 and the first gate dielectric layer 540.

EXPERIMENTAL EXAMPLE

The following experimental example is intended to illustrate that there is not much change in a threshold voltage variation of a thin film transistor according to an embodiment of the disclosure while the bending extent is significant. However, the experimental example does not limit the scope of the disclosure.

Figure 9:
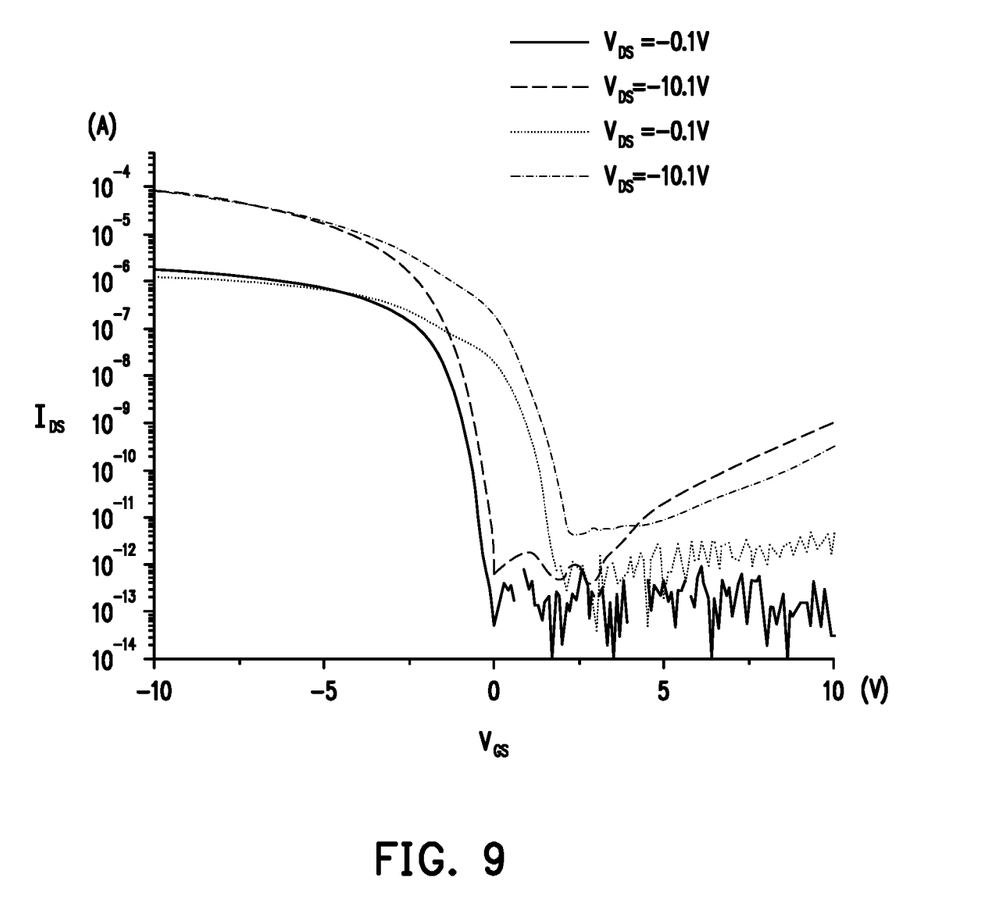
FIG. 9 is a curve graph illustrating characteristics of a thin film transistor according to a comparative example of the disclosure.
Figure 10:
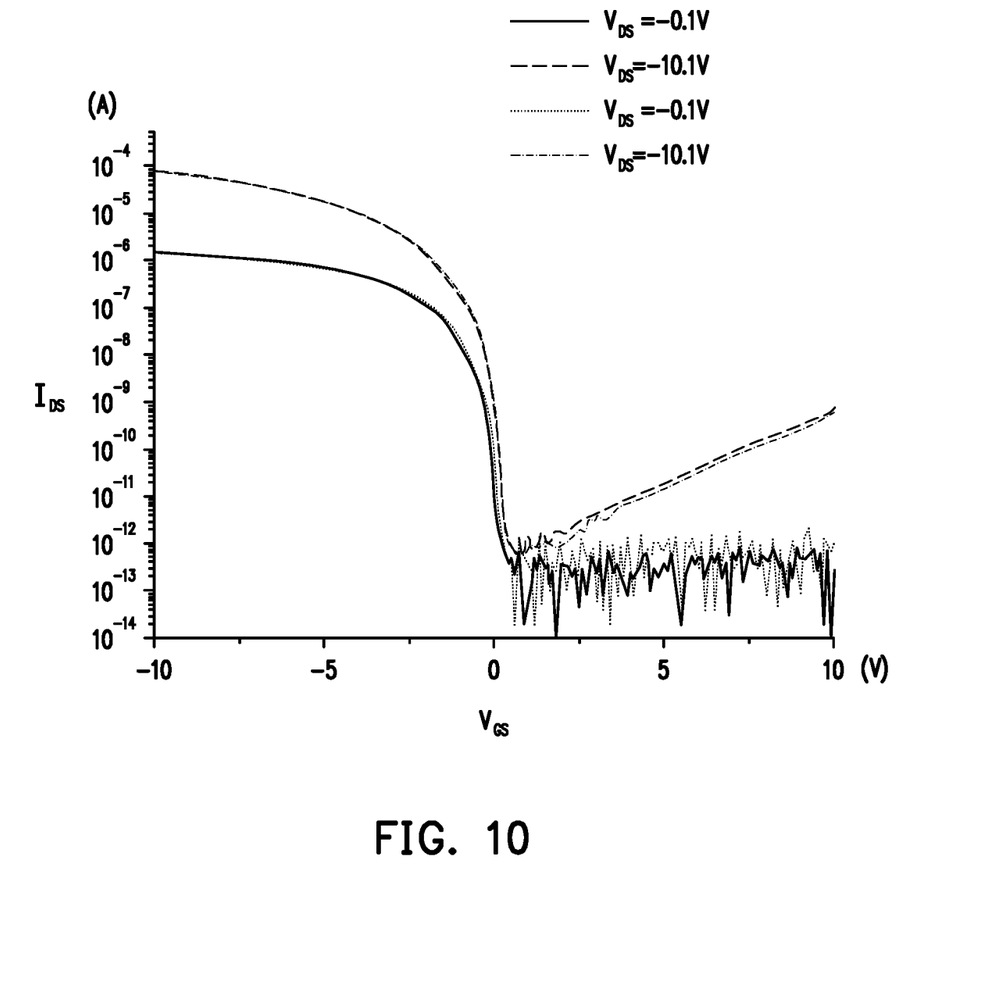
FIG. 10 is a curve graph illustrating characteristics of a thin film transistor according to an experimental example of the disclosure.

Please refer to both FIG. 9 and FIG. 10; FIG. 9 is a curve graph illustrating characteristics of a thin film transistor according to a comparative example of the disclosure; FIG. 10 is a curve graph illustrating characteristics of a thin film transistor according to an experimental example of the disclosure. The thin film transistor in the comparative example and the thin film transistor in the experimental example are both similar in terms of structure to the thin film transistor 100 with a top gate structure as embodied in FIG. 1E; the difference is that a hydrogen atom concentration of a first gate dielectric layer of the thin film transistor in the experimental example is less than $6.5 \times 10^{20}$ atoms/cm$^3$.

Specifically, when the same thin film transistor is measured before and after it is bent, FIG. 9 and FIG. 10 respectively show corresponding drain currents (labeled as IDS in the drawings) generated between a source and a drain after different gate biases (labeled as $V_{GS}$ in the drawings) are applied to a gate on the condition that the thin film transistor in the comparative example and the thin film transistor in the experimental example have drain biases (labeled as $V_{DS}$ in the drawings) of −0.1 volt and −10.1 volt between the source and the drain, respectively. In FIG. 9 and FIG. 10, the horizontal axes represent gate bias values (unit: volt), and the vertical axes represent correspondingly generated drain current values (unit: ampere). Solid lines represent the curve of the drain current values correspondingly generated after different gate biases are applied to the gate on the conditions that the thin film transistor is not bent yet and is at the drain bias of −0.1 volt. Dashed lines represent the curve of the drain current values correspondingly generated after different gate biases are applied to the gate on the conditions that the thin film transistor is not bent yet and is at the drain bias of −10.1 volt. Dotted lines represent the curve of the drain current values correspondingly generated after different gate biases are applied to the gate on the conditions that the thin film transistor is already bent and is at the drain bias of −0.1 volt. Dashed dotted lines represent the curve of the drain current values correspondingly generated after different gate biases are applied to the gate on the conditions that the thin film transistor is already bent and is at the drain bias of −10.1 volt.

In FIG. 9, before and after the thin film transistor is bent, the difference in the threshold voltage variations of the thin film transistor in the comparative example is about 0.4 volt. In FIG. 10, before and after the thin film transistor is bent, the difference in the threshold voltage variations of the thin film transistor in the experimental example is less than 0.04 volt. Thus, the thin film transistor in the experimental example has better reliability.

To sum up, the gate dielectric layer of the thin film transistor according to an embodiment of the disclosure is in contact with the semiconductor layer and has the hydrogen atom concentration of less than $6.5\times10^{20}$ atoms/cm$^3$, so that the number of Si—H bonds within the gate dielectric layer is corresponding reduced. Therefore, after the thin film transistor is subject to the bending stress, the possible electrical defects of the thin film transistor due to the bond breaking of the Si—H bonding in the first gate dielectric layer 140 may be reduced, thereby enhancing the reliability of the thin film transistor.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A thin film transistor, comprising:
   a flexible substrate;
   a semiconductor layer, located on the flexible substrate, wherein a material of the semiconductor layer comprises a polysilicon material;
   a first gate, located over a portion of the semiconductor layer;
   a first gate dielectric layer, located between the first gate and the semiconductor layer, the first gate dielectric layer being in contact with the semiconductor layer, a hydrogen atom concentration of the first gate dielectric layer being less than $6.5\times10^{20}$ atoms/cm$^3$, wherein the semiconductor layer is located between the flexible substrate and the first gate, and the thin film transistor is capable of being bended to have a minimum bending radius of 1 mm; and
   a second gate, wherein the semiconductor layer is located between the first gate and the second gate.

2. The thin film transistor of claim 1, further comprising a second gate dielectric layer located between the first gate and the first gate dielectric layer, a hydrogen atom concentration of the second gate dielectric layer being greater than $6.5\times10^{20}$ atoms/cm$^3$.

3. The thin film transistor of claim 1, wherein a material of the first gate dielectric layer comprises silicon oxide, silicon nitride, or a combination thereof.

4. The thin film transistor of claim 1, further comprising: a source and a drain respectively coupled to opposite ends of the semiconductor layer.

5. A manufacturing method of a thin film transistor, comprising:
   forming a second gate on a flexible substrate;
   forming a semiconductor layer on the flexible substrate, wherein a material of the semiconductor layer comprises a polysilicon material, the second gate is formed before forming the semiconductor layer, and the semiconductor layer is formed on the second gate;
   forming a first gate dielectric layer on the semiconductor layer, the first gate dielectric layer being in contact with the semiconductor layer, a hydrogen atom concentration of the first gate dielectric layer being less than $6.5\times10^{20}$ atoms/cm$^3$; and
   forming a first gate on the first gate dielectric layer, the first gate corresponding to a portion of the semiconductor layer, wherein the thin film transistor is capable of being bended to have a minimum bending radius of 1 mm.

6. The manufacturing method of the thin film transistor of claim 5, further comprising:
   forming a second gate dielectric layer on the first gate dielectric layer before forming the first gate, a hydrogen atom concentration of the second gate dielectric layer being greater than $6.5\times10^{20}$ atoms/cm$^3$, the first gate being formed on the second gate dielectric layer.

7. The manufacturing method of the thin film transistor of claim 5, wherein a method of forming the first gate dielectric layer comprises plasma-enhanced chemical vapor deposition, and a ratio of an inert gas flow to a total process gas flow of the plasma-enhanced chemical vapor deposition for forming the first gate dielectric layer is from 0.5 to 0.7.

8. The manufacturing method of the thin film transistor of claim 5, wherein a deposition rate of forming the first gate dielectric layer is from 2.5 Å/sec to 3.5 Å/sec.

9. The manufacturing method of the thin film transistor of claim 5, further comprising: forming a source and a drain respectively coupled to opposite ends of the semiconductor layer.

10. The thin film transistor of claim 1, wherein a difference between a threshold voltage variation of the thin film transistor with a minimum bending radius of 1 mm and a threshold voltage variation of the thin film transistor that is not bended is below 0.05 volt.

11. The manufacturing method of the thin film transistor of claim 5, wherein a difference between a threshold voltage variation of the thin film transistor with a minimum bending radius of 1 mm and a threshold voltage variation of the thin film transistor that is not bended is below 0.05 volt.

12. The manufacturing method of the thin film transistor of claim 5, wherein a material of the first gate dielectric layer comprises silicon oxide, silicon nitride, or a combination thereof.

13. The manufacturing method of the thin film transistor of claim 5, wherein a process temperature of the step of forming the semiconductor layer on the flexible substrate is below 600 degrees Celsius.

14. A manufacturing method of a thin film transistor, comprising:
   forming a semiconductor layer on a flexible substrate, wherein a material of the semiconductor layer comprises a polysilicon material;
   forming a first gate dielectric layer on the semiconductor layer, the first gate dielectric layer being in contact with the semiconductor layer, a hydrogen atom concentration of the first gate dielectric layer being less than $6.5\times10^{20}$ atoms/cm$^3$, wherein a deposition rate of forming the first gate dielectric layer is from 2.5 Å/sec to 3.5 Å/sec;
   forming a first gate on the first gate dielectric layer, the first gate corresponding to a portion of the semiconductor layer, wherein the thin film transistor is capable of being bended to have a minimum bending radius of 1 mm.

15. The manufacturing method of the thin film transistor of claim 14, further comprising:
   forming a second gate dielectric layer on the first gate dielectric layer before forming the first gate, a hydrogen atom concentration of the second gate dielectric layer being greater than $6.5\times10^{20}$ atoms/cm$^3$, the first gate being formed on the second gate dielectric layer.

16. The manufacturing method of the thin film transistor of claim 14, wherein a method of forming the first gate dielectric layer comprises plasma-enhanced chemical vapor deposition, and a ratio of an inert gas flow to a total process gas flow of the plasma-enhanced chemical vapor deposition for forming the first gate dielectric layer is from 0.5 to 0.7.

17. The manufacturing method of the thin film transistor of claim 14, further comprising: forming a source and a drain respectively coupled to opposite ends of the semiconductor layer.

18. The manufacturing method of the thin film transistor of claim 14, wherein a difference between a threshold voltage variation of the thin film transistor with a minimum bending radius of 1 mm and a threshold voltage variation of the thin film transistor that is not bended is below 0.05 volt.

19. The manufacturing method of the thin film transistor of claim 14, wherein a material of the first gate dielectric layer comprises silicon oxide, silicon nitride, or a combination thereof.

20. The manufacturing method of the thin film transistor of claim 14, wherein a process temperature of the step of forming the semiconductor layer on the flexible substrate is below 600 degrees Celsius.

\* \* \* \* \*